(12) United States Patent
Chang et al.

(10) Patent No.: US 12,456,982 B2
(45) Date of Patent: Oct. 28, 2025

(54) CLOCK AND DATA RECOVERY DEVICE

(71) Applicants: SILICON MITUS, INC., Seongnam-Si (KR); Silicon-Magic Semiconductor Technology (Hangzhou) Co., Ltd., Hangzhou (CN)

(72) Inventors: Young Jae Chang, Seoul (KR); Sung Ryong Lee, Seongnam-Si (KR); Jae Sam Shim, Seoul (KR)

(73) Assignees: SILICON MITUS, INC., Seongnam-Si (KR); Silicon-Magic Semiconductor Technology (Hangzhou) Co., Ltd., Hangzhou (CN)

( * ) Notice: Subject to any disclaimer, the term of this patent is extended or adjusted under 35 U.S.C. 154(b) by 85 days.

(21) Appl. No.: 18/503,959

(22) Filed: Nov. 7, 2023

(65) Prior Publication Data

US 2024/0154616 A1     May 9, 2024

(30) Foreign Application Priority Data

Nov. 7, 2022   (KR) .......................... 10-2022-0146826

(51) Int. Cl.
| | | |
|---|---|---|
| H03D 3/24 | (2006.01) | |
| H03L 7/087 | (2006.01) | |
| H03L 7/099 | (2006.01) | |
| H03L 7/107 | (2006.01) | |

(52) U.S. Cl.
CPC ............ *H03L 7/087* (2013.01); *H03L 7/0991* (2013.01); *H03L 7/1075* (2013.01)

(58) Field of Classification Search
CPC ..... H03L 7/087; H03L 7/0991; H03L 7/1075; H03L 7/0807; H04L 43/028

USPC .................................................. 375/371–376
See application file for complete search history.

(56) References Cited

U.S. PATENT DOCUMENTS

| | | | | |
|---|---|---|---|---|
| 10,491,365 B1 * | 11/2019 | Lin | ........................ | H04L 43/028 |
| 2011/0156777 A1 * | 6/2011 | Wei | ........................ | H03L 7/0807 |
| | | | | 327/157 |

FOREIGN PATENT DOCUMENTS

| | | |
|---|---|---|
| KR | 100780959 B1 | 12/2007 |
| KR | 20120025179 A | 3/2012 |
| KR | 101706196 B1 | 2/2017 |

* cited by examiner

*Primary Examiner* — Phuong Phu
(74) *Attorney, Agent, or Firm* — OSHA BERGMAN WATANABE & BURTON LLP

(57) ABSTRACT

A clock and data recovery device includes an equalizer that compensates for channel loss of input data, a phase detector that compares data output from the equalizer and a fed back clock and outputs an up signal and a down signal, a charge pump that operates according to the up signal and the down signal to output a control signal, a loop filter that removes a high-frequency component included in the control signal output from the charge pump, a voltage-controlled oscillator that changes a frequency of the clock and outputs the clock according to the control signal from which the high-frequency component is removed, and a voltage-controlled oscillator buffer that adjusts a slew rate of the clock output by the voltage-controlled oscillator according to the up signal and the down signal directly received from the phase detector and transmits the clock to the phase detector.

10 Claims, 6 Drawing Sheets

CLOCK AND DATA RECOVERY DEVICE

CROSS-REFERENCE TO RELATED APPLICATION

This application claims priority to Korean Patent Application No. 10-2022-0146826 filed on Nov. 7, 2022 and all the benefits accruing therefrom under 35 U.S.C. § 119, the contents of which are incorporated by reference in their entirety.

BACKGROUND

The present disclosure relates to a clock and data recovery device. More specifically, the present disclosure relates to a clock and data recovery device that can improve clock and data recovery characteristics by reducing loop delay in a bang-bang loop.

Generally, a clock data recovery loop using a bang-bang style phase detector performs an operation of comparing the timing of data and clock to change the frequency of the clock faster or slower in order to maintain a steady-stage, that is, a locking state operation.

FIG. 1 is a diagram illustrating a clock and data recovery device according to the prior art, and FIG. 2 is a diagram illustrating signal processing timing for synchronizing the clock and data in the clock and data recovery device according to the prior art.

Referring to FIGS. 1 and 2, the clock and data recovery device according to the prior art is configured with an equalizer 10 that compensates for channel loss of input data, a phase detector 20 that compares data output from the equalizer 10 and a clock fed back from a voltage-controlled oscillator 50 and outputs an up signal UP and a down signal DN, a charge pump 30 that operates according to the up signal and the down signal to output a control signal that controls the voltage-controlled oscillator 50, a loop filter 40 that removes a high-frequency component included in the control signal output by the charge pump 30, and the voltage-controlled oscillator 50 that changes the frequency of the clock and outputs the clock according to the control signal from which the high-frequency component has been removed.

However, according to this prior art, a significant delay occurs in comparing the timing of data and clock and applying a corresponding frequency change of the voltage-controlled oscillator, and accordingly, this becomes a factor that increases a jitter of the bang-bang loop.

CITATION LIST

Patent Literature

PTL 1: Korean Patent Publication No. 10-0780959 (Registration date: Nov. 23, 2007, Title: Delay synchronous loop circuit capable of reducing bang-bang jitter)

PTL 2: Korean Patent Publication No. 10-1706196 (Registration date: Feb. 7, 2017, Title: Bang-bang phase detector with improved phase synchronization performance)

PTL 3: Korean Patent Publication No. 10-2012-0025179 (Publication date: Mar. 15, 2012, Title: Clock and data recovery circuit with improved jitter characteristics using bang-bang phase detector)

SUMMARY

One or more embodiments of the present disclosure provide a clock and data recovery device that can improve clock and data recovery characteristics by reducing loop delay in a bang-bang loop.

In addition, more specifically, one or more embodiments of the present disclosure provide a clock and data recovery device that improves data and clock recovery characteristics even from external input noise by reducing bang-bang loop jitter by immediately reflecting an up signal and down signal of the bang-bang loop in a clock, which is an output signal of a voltage-controlled oscillator, without delay and improving timing margin between an internal clock and data generated inside the clock and data recovery circuit, and enhances tracking performance of the clock and data recovery loop by immediately reflecting a timing error of the clock compared to data in the loop when the timing error of the clock compared to data occurs in the clock and data recovery circuit.

One or more embodiments of the present disclosure provide a clock and data recovery device that reduces loop delay in a bang-bang loop, the device including an equalizer that compensates for channel loss of input data, a phase detector that compares data output from the equalizer and a fed back clock and outputs an up signal UP and a down signal DN, a charge pump that operates according to the up signal and the down signal to output a control signal, a loop filter that removes a high-frequency component included in the control signal output from the charge pump, a voltage-controlled oscillator that changes a frequency of the clock and outputs the clock according to the control signal from which the high-frequency component is removed, and a voltage-controlled oscillator buffer that adjusts a slew rate of the clock output by the voltage-controlled oscillator according to the up signal and the down signal directly received from the phase detector and transmits the clock to the phase detector.

In the clock and data recovery device, the phase detector is a bang-bang phase detector.

In the clock and data recovery device, the phase detector outputs the up signal when a phase of a clock fed back from the voltage-controlled oscillator buffer is slower than the data output by the equalizer, outputs the down signal when the phase of the clock fed back from the voltage-controlled oscillator buffer is faster than the data output by the equalizer, and, when the up signal is received, a current flowing in the voltage-controlled oscillator buffer increases and a slew rate of the clock output by the voltage-controlled oscillator increases, so that the data output by the equalizer and the clock output by the voltage-controlled oscillator are synchronized.

In the clock and data recovery device, when the down signal is received, the current flowing in the voltage-controlled oscillator buffer decreases and the slew rate of the clock output by the voltage-controlled oscillator decreases, so that the data output by the equalizer and the clock output by the voltage-controlled oscillator are synchronized.

In the clock and data recovery device according to one or more embodiments of the present disclosure, the voltage-controlled oscillator buffer includes a first CMOS whose gate terminals are commonly connected to an output terminal of the voltage-controlled oscillator, a first switch connected between a power terminal and a source terminal of a first PMOS constituting the first CMOS and always maintained in an on state, a second switch connected between a source terminal of a first NMOS constituting the first CMOS and a ground terminal and always maintained in the on state, a third switch connected between the power terminal and the source terminal of the first PMOS and turned on by the up signal, a fourth switch connected between the source terminal of the first NMOS and the ground terminal and turned on by the up signal, a fifth switch connected between the power terminal and the source terminal of the first PMOS and turned on by a signal obtained by inverting the down signal, a sixth switch connected between the source terminal of the first NMOS and the ground terminal and turned on by the signal obtained by inverting the down signal, a second CMOS whose gate terminals are commonly connected to a drain terminal of the first CMOS, a seventh switch connected between the power terminal and the source terminal of the second PMOS constituting the second CMOS and always maintained in the on state, an eighth switch connected between the source terminal of the second NMOS constituting the second CMOS and the ground terminal and always maintained in the on state, a ninth switch connected between the power terminal and the source terminal of the second PMOS and turned on by the up signal, a tenth switch connected between the source terminal of the second NMOS and the ground terminal and turned on by the up signal, an eleventh switch connected between the power terminal and the source terminal of the second PMOS and turned on by the signal obtained by inverting the down signal, and a twelfth switch connected between the source terminal of the second NMOS and the ground terminal and turned on by the signal obtained by inverting the down signal.

In the clock and data recovery device, when both the up signal and the down signal received from the phase detector are at a certain level, the third switch, the fourth switch, the ninth switch, and the tenth switch are turned off, and the fifth switch, the sixth switch, the eleventh switch, and the twelfth switch are turned on.

In the clock and data recovery device, when the up signal received from the phase detector is at a higher level than the certain level, the third switch, the fourth switch, the fifth switch, the sixth switch, and the ninth switch, the tenth switch, the eleventh switch, and the twelfth switch are turned on.

In the clock and data recovery device, when the up signal received from the phase detector is at the higher level, compared to a case where both the up signal and the down signal are at the certain level, the current flowing in the voltage-controlled oscillator buffer increases and the slew rate of the clock output by the voltage-controlled oscillator increases, so that the data output by the equalizer and the clock output by the voltage-controlled oscillator are synchronized.

In the clock and data recovery device, when the down signal received from the phase detector is at a higher level than the certain level, the third switch, the fourth switch, the fifth switch, the sixth switch, the ninth switch, the tenth switch, the eleventh switch, the twelfth switch are turned off.

In the clock and data recovery device, when the down signal received from the phase detector is at the higher level, compared to a case where both the up signal and the down signal are at the certain level, the current flowing in the voltage-controlled oscillator buffer decreases and the slew rate of the clock output by the voltage-controlled oscillator decreases, so that the data output by the equalizer and the clock output by the voltage-controlled oscillator are synchronized.

According to one or more embodiments of the present disclosure, the clock and data recovery device is provided with improve clock and data recovery characteristics by reducing loop delay in the bang-bang loop.

In addition, there is an effect of reducing the bang-bang loop jitter by immediately reflecting the up signal and down signal of the bang-bang loop in the clock, which is an output signal of the voltage-controlled oscillator, without delay, improving the data and clock recovery characteristics even from external input noise by improving timing margin between the internal clock and data generated inside the clock and data recovery circuit, and enhancing tracking performance of the clock and data recovery loop by immediately reflecting a timing error of the clock compared to data in the loop when the timing error of the clock compared to data occurs in the clock and data recovery circuit.

BRIEF DESCRIPTION OF THE DRAWINGS

Exemplary embodiments can be understood in more detail from the following description taken in conjunction with the accompanying drawings, in which.

DETAILED DESCRIPTION

Figure 1:
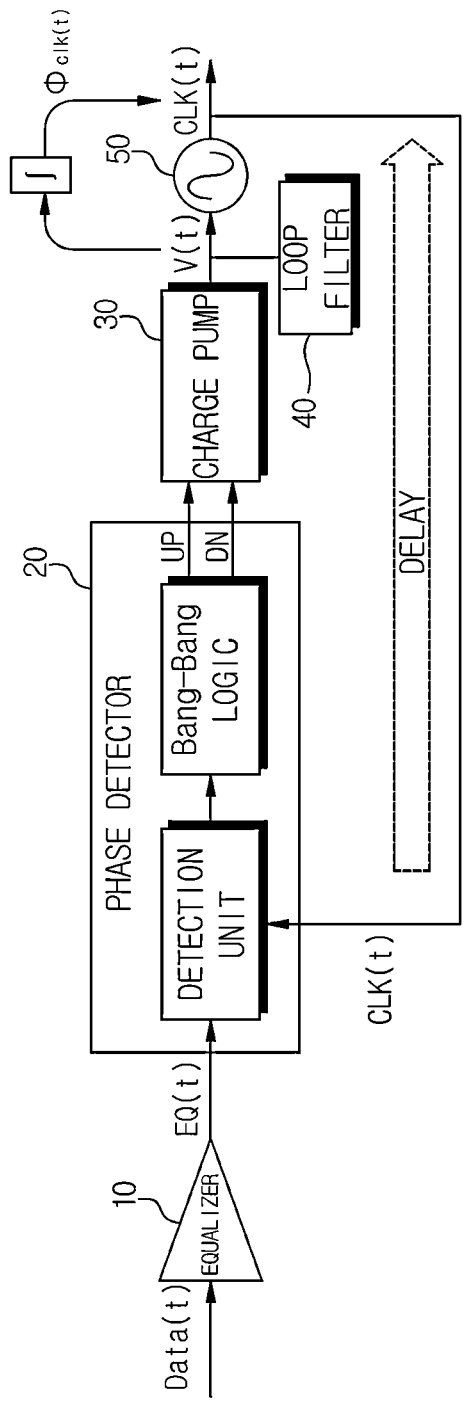
FIG. 1 is a diagram illustrating a clock and data recovery device according to the prior art.

Specific structural or functional descriptions of the embodiments according to the concept of the present disclosure disclosed in this specification are merely illustrative for the purpose of describing the embodiments according to the concept of the present disclosure. The embodiments according to the concept of the present disclosure may be implemented in various forms and are not limited to the embodiments described in this specification.

Since the embodiments according to the concept of the present disclosure may be subjected to various changes and have various forms, the embodiments will be illustrated in the drawings and described in detail in this specification. However, this is not intended to limit the embodiments according to the concept of the present disclosure to specific disclosed forms, and the embodiments includes all changes, equivalents, or substitutes included in the spirit and technical scope of the present disclosure.

Unless otherwise defined, all terms used herein, including technical or scientific terms, have the same meaning as commonly understood by a person of ordinary skill in the technical field to which the present disclosure pertains. Terms as defined in commonly used dictionaries should be interpreted as having a meaning consistent with the meaning in the context of the related technology, and should not be interpreted in an idealized or overly formal sense unless clearly defined in this specification.

In the following, one or more embodiments of the present disclosure will be described in detail with reference to the accompanying drawings.

Figure 3:
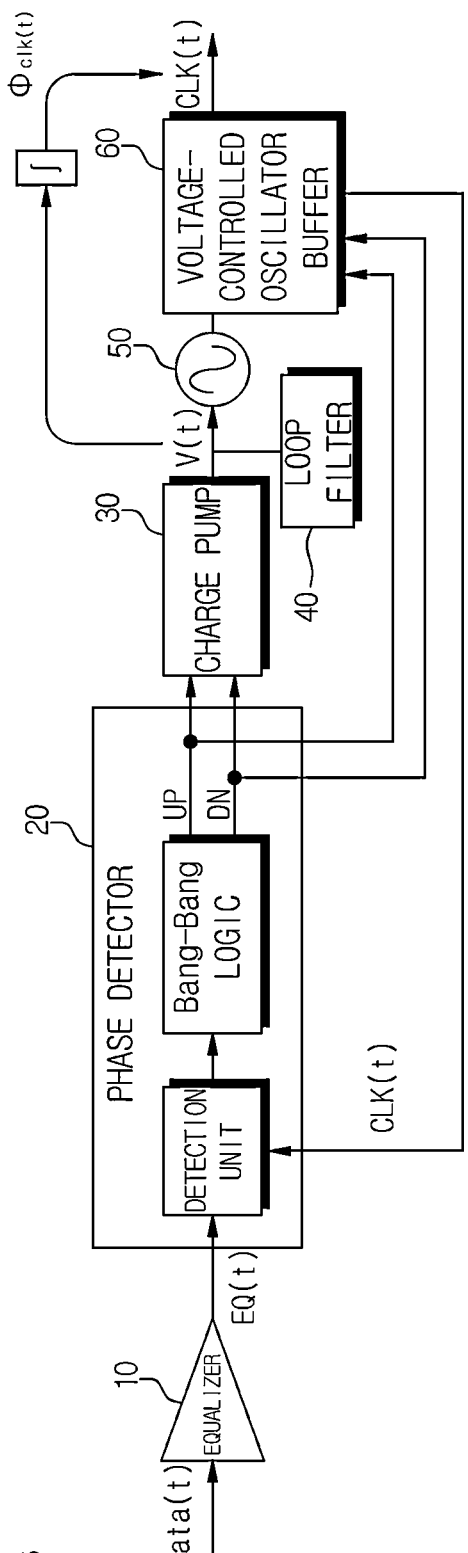
FIG. 3 is a diagram illustrating a clock and data recovery device in accordance with one or more embodiments of the present disclosure.
Figure 4:
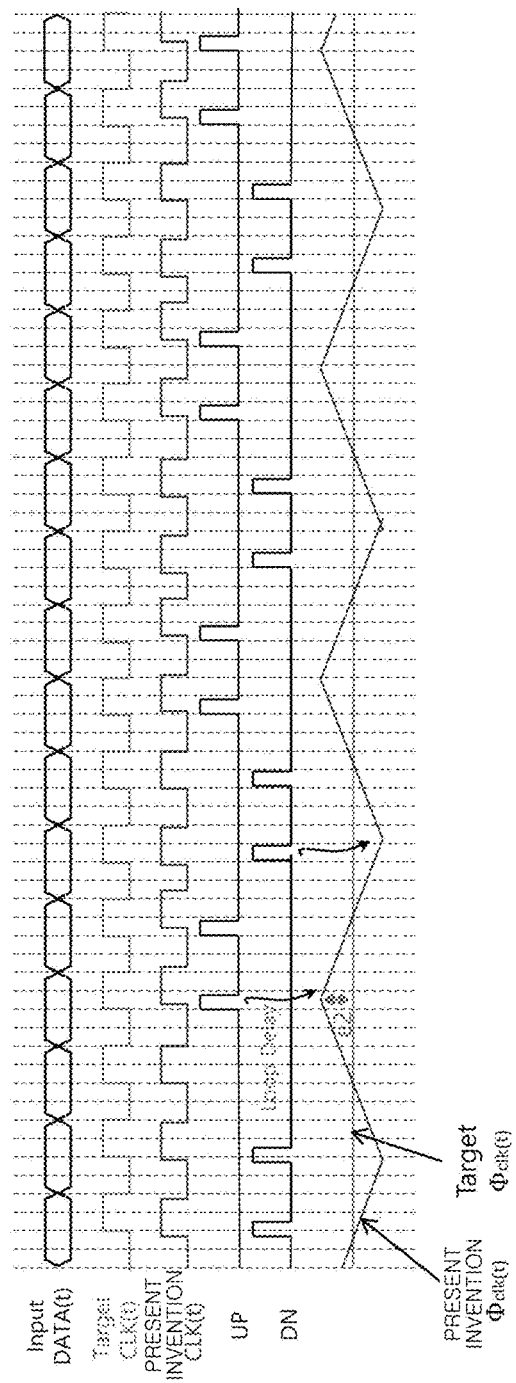
FIG. 4 is a diagram illustrating signal processing timing for synchronizing clock and data in the clock and data recovery device in accordance with one or more embodiments of the present disclosure.

FIG. 3 is a diagram illustrating a clock and data recovery device according to one or more embodiments of the present disclosure, and FIG. 4 is a diagram illustrating signal processing timing for synchronizing clock and data in the clock and data recovery device according to one or more embodiments of the present disclosure.

Referring to FIGS. 3 and 4, the clock and data recovery device according to one or more embodiments of the present disclosure includes an equalizer 10, a phase detector 20, a charge pump 30, a loop filter 40, a voltage-controlled oscillator 50, and a voltage-controlled oscillator buffer 60.

The equalizer 10 is a component that compensates for channel loss of data input from the outside. Specifically, the equalizer 10 may receive a high-speed transmission signal and perform a function of compensating channel loss with gain corresponding to the frequency of data so that an internal IC can process the high-speed transmission signal.

The phase detector 20 is a component that compares data output from the equalizer 10 and clock fed back from the voltage-controlled oscillator buffer 60, which will be described later, and outputs an up signal UP and a down signal DN in the form of pulses that reflect a phase difference between the two signals. For example, the phase detector 20 may be a bang-bang phase detector.

For example, the phase detector 20 may be configured to output the up signal UP when a phase of the clock fed back from the voltage-controlled oscillator buffer 60 is slower than the data output by the equalizer 10, and output the down signal DN when the phase of the clock fed back from the voltage-controlled oscillator buffer 60 is faster than the data output by the equalizer 10.

The charge pump 30 is a component that outputs a control signal that controls the voltage-controlled oscillator 50 by operating according to the up signal UP and down signal DN input in the form of pulses.

The loop filter 40 is a component that removes the high-frequency component included in the control signal output by the charge pump 30, and may be a low pass filter (LPF).

The voltage-controlled oscillator 50 is a component that changes the frequency of the clock and outputs the clock according to the control signal from which the high-frequency component has been removed.

The voltage-controlled oscillator buffer 60 is a component that adjusts a slew rate of the clock output by the voltage-controlled oscillator 50 according to the up signal UP and down signal DN directly received from the phase detector 20 and transmits the clock to the phase detector 20.

For example, the phase detector 20 may be configured to output the up signal UP when the phase of the clock fed back from the voltage-controlled oscillator buffer is slower than the data output by the equalizer and outputs the down signal DN when the phase of the clock fed back from the voltage-controlled oscillator 50 is faster than the data output by the equalizer. When the up signal is received, the current flowing in the voltage-controlled oscillator buffer 60 increases and the slew rate of the clock output by the voltage-controlled oscillator 50 increases, so that the data output by the equalizer and the clock output by the voltage-controlled oscillator 50 may be synchronized.

In addition, for example, the phase detector 20 may be configured to output the up signal UP when the phase of the clock fed back from the voltage-controlled oscillator buffer 60 is slower than the data output by the equalizer and outputs the down signal DN when the phase of the clock fed back from the voltage-controlled oscillator 50 is faster than the data output by the equalizer. When the down signal is received, the current flowing in the voltage-controlled oscillator buffer 60 decreases and the slew rate of the clock output by the voltage-controlled oscillator 50 decreases, so that the data output by the equalizer and the clock output by the voltage-controlled oscillator 50 may be synchronized.

In the following, with additional reference to FIG. 5, a specific configuration of the voltage controlled oscillator buffer 60 will be exemplarily described.

Figure 5:
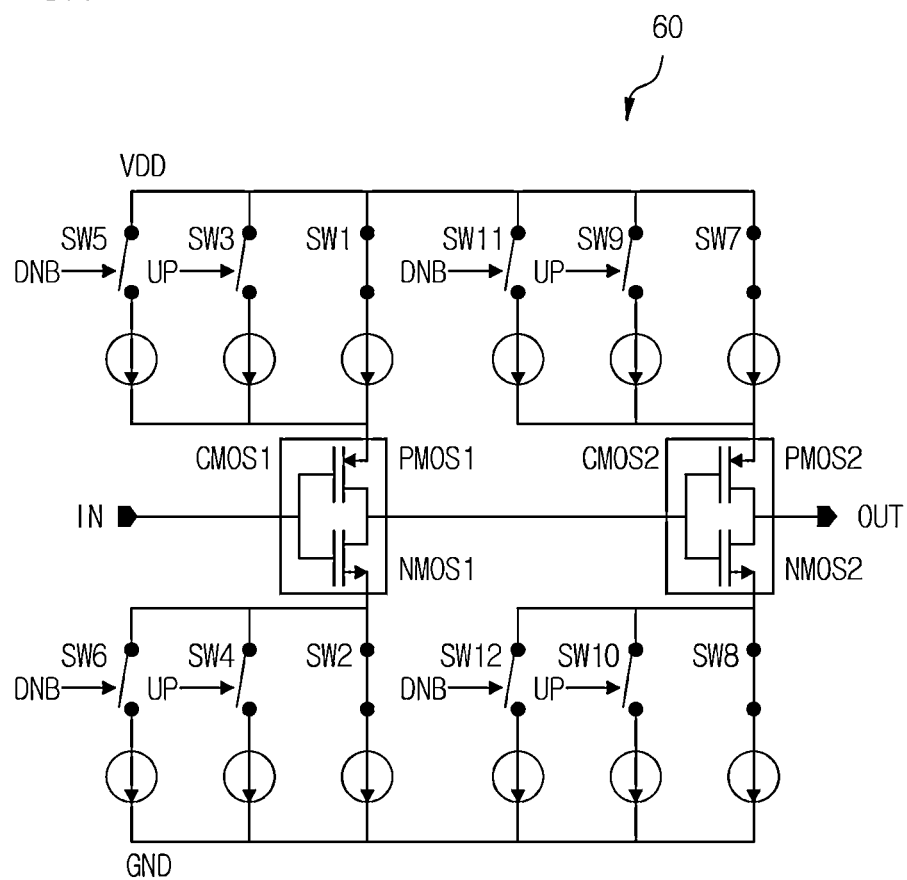
FIG. 5 is a diagram illustrating an exemplary configuration of a voltage-controlled oscillator buffer in accordance with one or more embodiments of the present disclosure.

Referring further to FIG. 5, the voltage-controlled oscillator buffer 60 may be configured to include a first CMOS CMOS1, a first switch SW1, a second switch SW2, a third switch SW3, a fourth switch SW4, a fifth switch SW5, a sixth switch SW6, a second CMOS CMOS2, a seventh switch SW7, an eighth switch SW8, a ninth switch SW9, a tenth switch SW10, an eleventh switch SW11, and a twelfth switch SW12.

Two gate terminals of the first CMOS CMOS1 are commonly connected to an output terminal IN of the voltage-controlled oscillator 50. That is, a gate terminal of a first PMOS PMOS1 constituting the first CMOS CMOS1 and a gate terminal of a first NMOS NMOS1 are commonly connected to the output terminal IN of the voltage-controlled oscillator 50.

The first switch SW1 is connected between a power terminal VDD and a source terminal of the first PMOS PMOS1 constituting the first CMOS CMOS1, and is always maintained in an on state.

The second switch SW2 is connected between a source terminal of the first NMOS NMOS1 constituting the first CMOS CMOS1 and a ground terminal GND, and is always maintained in the on state.

The third switch SW3 is connected between the power terminal VDD and the source terminal of the first PMOS PMOS1, and is turned on by the up signal UP directly transmitted by the phase detector 20.

The fourth switch SW4 is connected between the source terminal of the first NMOS NMOS1 and the ground terminal GND, and is turned on by the up signal UP directly transmitted by the phase detector 20.

The fifth switch SW5 is connected between the power terminal VDD and the source terminal of the first PMOS PMOS1, and is turned on by a signal DNB that is an inverted signal of the down signal DN directly transmitted by the phase detector 20.

The sixth switch SW6 is connected between the source terminal of the first NMOS NMOS1 and the ground terminal GND, and is turned on by the signal DNB obtained by inverting the down signal DN directly transmitted by the phase detector 20.

Two gate terminals of the second CMOS CMOS2 are commonly connected to two drain terminals of the first CMOS CMOS1, two drain terminals of the second CMOS CMOS2 are commonly connected to an output terminal, and this output terminal is connected to the phase detector 20.

The seventh switch SW7 is connected between the power terminal VDD and a source terminal of a second PMOS PMOS2 constituting the second CMOS CMOS2, and is always maintained in the on state.

The eighth switch SW8 is connected between a source terminal of a second NMOS NMOS2 constituting the second CMOS CMOS2 and the ground terminal GND, and is always maintained in the on state.

The ninth switch SW9 is connected between the power terminal VDD and the source terminal of the second PMOS PMOS2, and is turned on by the up signal UP directly transmitted by the phase detector 20.

The tenth switch SW10 is connected between the source terminal of the second NMOS NMOS2 and the ground terminal (GND), and is turned on by the up signal UP directly transmitted by the phase detector 20.

The eleventh switch SW11 is connected between the power terminal VDD and the source terminal of the second PMOS PMOS2, and is turned on by the signal DNB obtained by inverting the down signal DN directly transmitted by the phase detector 20.

The twelfth switch SW12 is connected between the source terminal of the second NMOS NMOS2 and the ground terminal GND, and is turned on by the signal DNB obtained by inverting the down signal DN directly transmitted by the phase detector 20.

In one or more embodiments, when both the up signal UP and down signal DN directly received by the voltage-controlled oscillator buffer 60 from the phase detector 20 are at a low level, the third switch SW3, the fourth switch SW4, the ninth switch SW9, and the tenth switch SW10 turned off, and the fifth switch SW5, the sixth switch SW6, the eleventh switch SW11, and the twelfth switch SW12 are turned on.

The fact that both the up signal UP and the down signal DN directly received by the voltage-controlled oscillator buffer 60 from the phase detector 20 are at the low level means that the data output by the equalizer 10 and the clock output by the voltage-controlled oscillator 50 are synchronized.

In one or more embodiments, when the up signal UP directly received by the voltage-controlled oscillator buffer 60 from the phase detector 20 is at a high level, the third switch SW3, the fourth switch SW4, the fifth switch SW5, the sixth switch SW6, the ninth switch SW9, the tenth switch SW10, the eleventh switch SW11, and the twelfth switch SW12 are turned on.

The fact that the up signal UP received directly by the voltage-controlled oscillator buffer 60 from the phase detector 20 is at the high level means that the phase of the clock output by the voltage-controlled oscillator 50 is slower than the data output by the equalizer 10, that is, the clock is in lagging phase.

In this case, that is, when the up signal UP received by the voltage-controlled oscillator buffer 60 from the phase detector 20 is at the high level, it may be configured in such a way that, compared to the case where both the up signal UP and the down signal DN are at the low level, the current flowing in the voltage-controlled oscillator buffer 60 increases and the slew rate of the clock output by the voltage-controlled oscillator 50 increases, so that the data output by the equalizer and the clock output by the voltage control oscillator 50 are synchronized.

In one or more embodiments, when the down signal DN directly received by the voltage-controlled oscillator buffer 60 from the phase detector 20 is at the high level, the third switch SW3, the fourth switch SW4, the fifth switch SW5, the sixth switch SW6, the ninth switch SW9, the tenth switch SW10, the eleventh switch SW11, and the twelfth switch SW12 are turned off.

The fact that the down signal DN received by the voltage-controlled oscillator buffer 60 from the phase detector 20 is at the high level means that the phase of the clock output by the voltage-controlled oscillator 50 is faster than the data output by the equalizer 10, that is, the clock is in leading phase.

In this case, that is, when the down signal DN received from the phase detector 20 is at the high level, it may be configured in such a way that, compared to the case where both the up signal UP and the down signal DN are at the low level, the current flowing in the voltage-controlled oscillator buffer 60 decreases and the slew rate of the clock output by the voltage-controlled oscillator 50 decreases, so that the data output by the equalizer and the clock output by the voltage control oscillator 50 are synchronized.

In the following, one or more embodiments of the present disclosure described in detail above will be described.

As explained previously, the clock data recovery device according to one or more embodiments of the present disclosure is required at the front end of the IC in order to align the input data and the clock with accurate timing.

The phase detector 20 using a bang-bang loop compares output data EQ(t) of the equalizer 10 that receives a high-speed transmission signal and processes it so that the internal IC can process the high-speed transmission signal and a clock CLK(t) of the voltage-controlled oscillator 50 and generates the up signal UP and the down signal DN. When a phase Φ of the clock generated by the voltage-controlled oscillator 50 is slower than the data, the phase detector 20 generates the up signal UP to increase the frequency of the clock output by the voltage-controlled oscillator 50, and the phase Φ, which is an integral value of frequency, is pulled forward. In contrast, when the clock is faster than the data, the phase detector 20 generates the down signal DN, the frequency of the clock output by voltage-controlled oscillator 50 is lowered, and the phase, which is the integral value of the frequency, is also pushed back. The phase detector 20 generates the up signal UP and the down signal DN while comparing input data and the clock in real time, and maintains a position of the clock where data can be properly processed.

Figure 2:
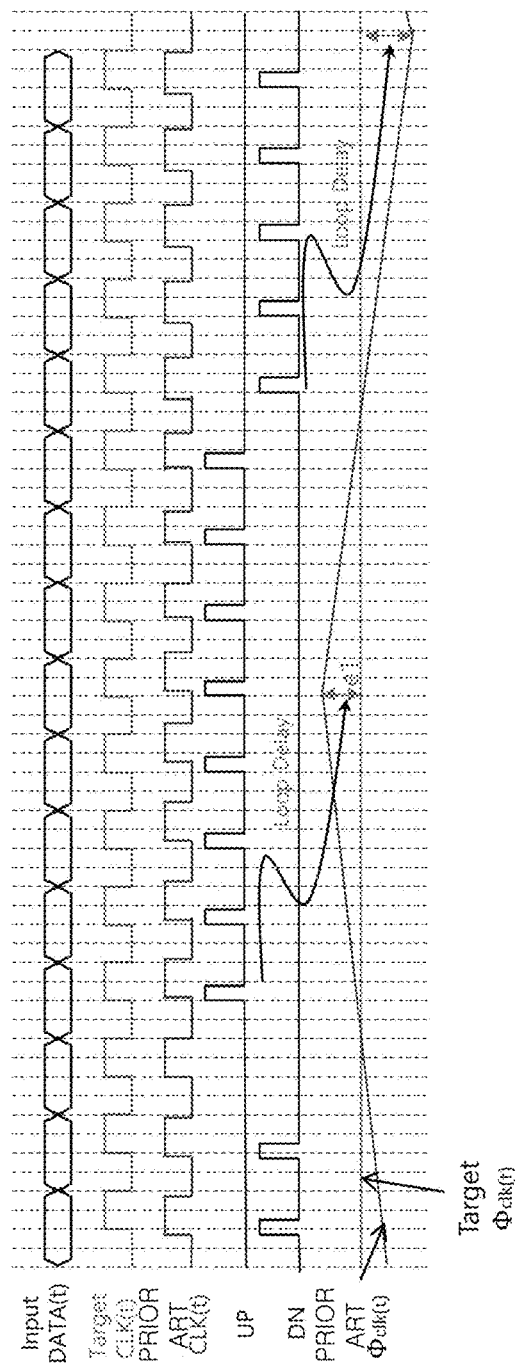
FIG. 2 is a diagram illustrating signal processing timing for synchronizing clock and data in the clock and data recovery device according to the prior art.

However, according to the prior art, due to a timing error between the output data EQ(t) of the equalizer 10 and the clock, the up signal UP and the down signal DN are generated, and a delay in many circuit blocks occurs in changing the frequency of the clock output by the voltage-controlled oscillator 50 through this. This is represented in FIG. 2. This is called loop delay. As the loop delay increases, a phase error e1 increases, and thus a problem in which the clock deviates from normal timing at which data can be extracted.

If the up signal UP and down signal DN are directly reflected in $\Phi_{clk(t)}$, which is the phase of the clock, not only does the phase error decreases, but also the response speed of the loop also becomes faster, based on a target $\Phi_{clk(t)}$ in FIG. 2.

In one or more embodiments of the present disclosure, as illustrated in FIG. 3, the up signal UP and down signal DN, which are information about changes in the loop, are directly transmitted to the voltage-controlled oscillator buffer 60 without going through the charge pump 30, the loop filter 40, and the voltage-controlled oscillator 50. That is, one or more embodiments of the present disclosure relate to a method of immediately reflecting the slew rate of the output signal of the voltage-controlled oscillator 50 in the loop by adjusting the current according to the up signal UP and down signal DN. If the clock is pushed back behind the data, the up signal UP is generated, and the current flowing in the voltage-controlled oscillator buffer 60 during this period is increased to increase the slew rate, of the clock, that is, slope, thereby capable of achieving the effect of pulling the clock forward. If the down signal DN occurs, conversely, the current flowing in the voltage-controlled oscillator buffer 60 is decreased to decrease the slew rate, that is, the slope, thereby capable of achieving the effect of pushing the clock back. To briefly describe again, the clock and data recovery device according to one or more embodiments of the present disclosure minimizes the loop delay by immediately adjusting the slew rate of the output signal of the voltage-controlled oscillator 50 according to the up signal UP and down signal DN, that is, by increasing the slew rate in the case of the up signal UP and decreasing the slew rate in the case of the down signal DN.

FIG. 4 illustrates the principle that when the present disclosure is applied, a smaller difference occurs in the timing at which the phase should be normally positioned compared to a circuit implemented in the prior art. Compared to the phase error e1 according to the prior art in FIG. 2, not only the phase error e2 according to one or more embodiments of the present disclosure is reduced, but the bang-bang triangle period is also shortened, which means improved characteristics of the clock and data recovery circuit.

Figure 6:
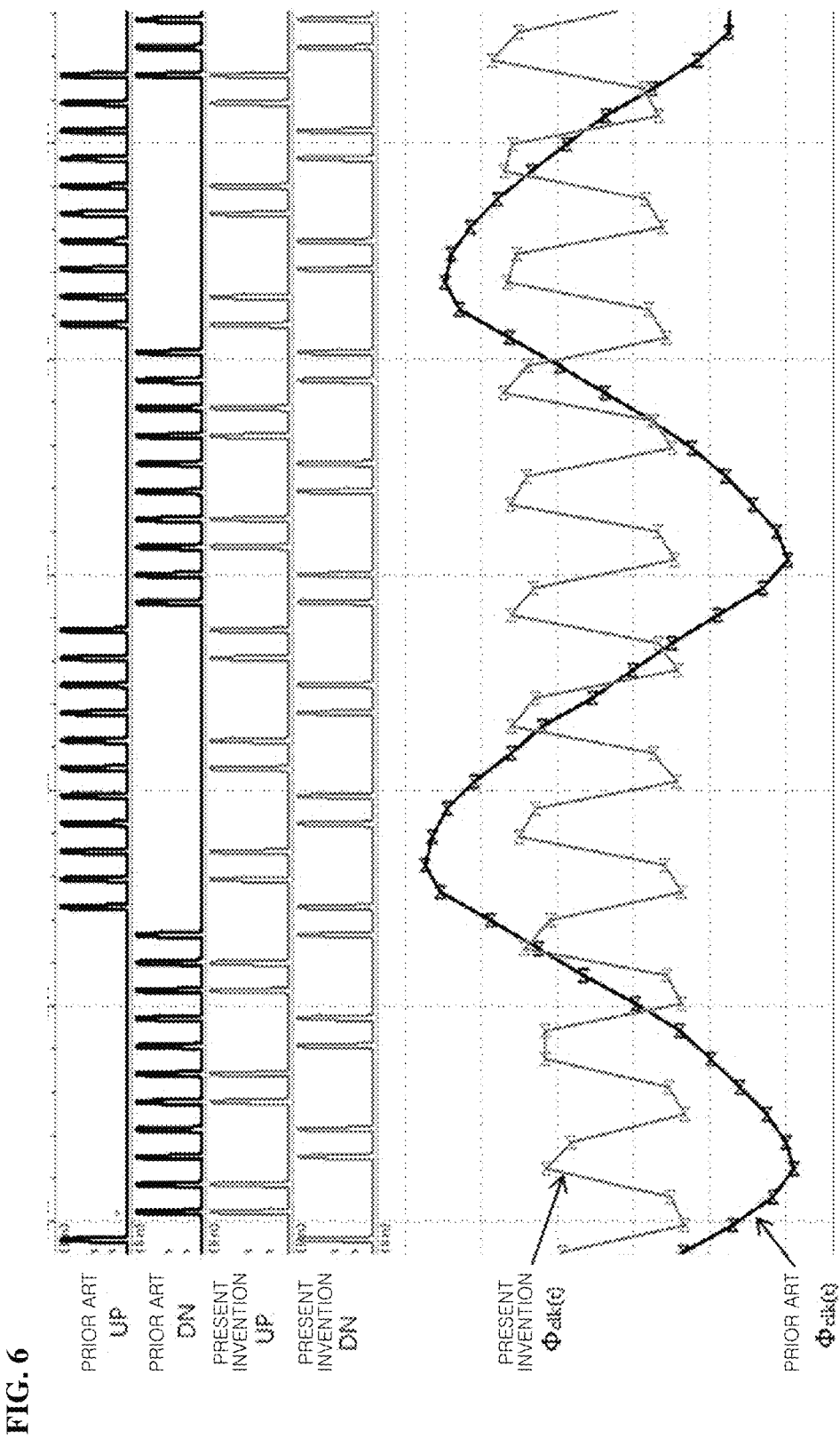
FIG. 6 is a diagram illustrating phase characteristics of clocks compared to each other in the prior art and one or more embodiments of the present disclosure.

FIG. 6 is a diagram illustrating the phase characteristics of clocks compared to each other in the prior art and one or more embodiments of the present disclosure, and FIG. 6 illustrates simulation results in which $\Phi_{clk(t)}$ was improved by applying the one or more embodiments of the present disclosure to an actual circuit. As can be seen from the simulation results, when one or more embodiments of the present disclosure are applied, it can be confirmed that an error of an actually implemented phase at the normal position of the middle timing of the data is significantly reduced.

According to one or more embodiments of the present disclosure, as described in detail above, there is an effect of providing the clock and data recovery device that can improve clock and data recovery characteristics by reducing loop delay in the bang-bang loop.

In addition, there is an effect of reducing the bang-bang loop jitter by immediately reflecting the up signal and down signal of the bang-bang loop to the clock, which is the output signal of the voltage-controlled oscillator, without delay, improving data and clock recovery characteristics even from external input noise by improving timing margin between the internal clock and data generated inside the clock and data recovery circuit, and improving tracking performance of the clock and data recovery loop by immediately reflecting a timing error of the clock compared to data in the loop when the timing error of the clock compared to data occurs in the clock and data recovery circuit.

Although the clock and data recovery device has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. A clock and data recovery device that reduces loop delay in a bang-bang loop, the clock and data recovery device comprising:
    an equalizer that compensates for channel loss of input data;
    a phase detector that compares data output from the equalizer and a fed back clock and outputs an up signal and a down signal;
    a charge pump that operates according to the up signal and the down signal to output a control signal;
    a loop filter that removes a high-frequency component included in the control signal output from the charge pump;
    a voltage-controlled oscillator that changes a frequency of the clock and outputs the clock according to the control signal from which the high-frequency component is removed; and
    a voltage-controlled oscillator buffer that adjusts a slew rate of the clock output by the voltage-controlled oscillator according to the up signal and the down signal directly received from the phase detector and transmits the clock to the phase detector,
    wherein the phase detector outputs the up signal when a phase of a clock fed back from the voltage-controlled oscillator buffer is slower than the data output by the equalizer, and outputs the down signal when the phase of the clock fed back from the voltage-controlled oscillator buffer is faster than the data output by the equalizer.

2. The device of claim 1, wherein
the phase detector is a bang-bang phase detector.

3. The device of claim 1, wherein
when the up signal is received, a current flowing in the voltage-controlled oscillator buffer increases and a slew rate of the clock output by the voltage-controlled oscillator increases, so that the data output by the equalizer and the clock output by the voltage-controlled oscillator are synchronized.

4. The device of claim 3, wherein
when the down signal is received, the current flowing in the voltage-controlled oscillator buffer decreases and the slew rate of the clock output by the voltage-controlled oscillator decreases, so that the data output by the equalizer and the clock output by the voltage-controlled oscillator are synchronized.

5. The device of claim 1, wherein
the voltage-controlled oscillator buffer comprises:
    a first CMOS whose gate terminals are commonly connected to an output terminal of the voltage-controlled oscillator,
    a first switch connected between a power terminal and a source terminal of a first PMOS constituting the first CMOS and always maintained in an on state,
    a second switch connected between a source terminal of a first NMOS constituting the first CMOS and a ground terminal and always maintained in the state,
    a third switch connected between the power terminal and the source terminal of the first PMOS and turned on by the up signal,
    a fourth switch connected between the source terminal of the first NMOS and the ground terminal and turned on by the up signal,
    a fifth switch connected between the power terminal and the source terminal of the first PMOS and turned on by a signal obtained by inverting the down signal,
    a sixth switch connected between the source terminal of the first NMOS and the ground terminal and turned on by the signal obtained by inverting the down signal,
    a second CMOS whose gate terminals are commonly connected to a drain terminal of the first CMOS,
    a seventh switch connected between the power terminal and the source terminal of the second PMOS constituting the second CMOS and always maintained in the on state, an eighth switch connected between the source terminal of the second NMOS constituting the second CMOS and the ground terminal and always maintained in the on state, a ninth switch connected between the power terminal and the source terminal of the second PMOS and turned on by the up signal, a tenth switch connected between the source terminal of the second NMOS and the ground terminal and turned on by the up signal, an eleventh switch connected between the power terminal and the source terminal of the second PMOS and turned on by the signal obtained by inverting the down signal, and a twelfth switch connected between the source terminal of the second NMOS and the ground terminal and turned on by the signal obtained by inverting the down signal.

6. The device of claim 5, wherein
when both the up signal and the down signal received from the phase detector are at a certain level, the third switch, the fourth switch, the ninth switch, and the tenth switch are turned off, and the fifth switch, the sixth switch, the eleventh switch, and the twelfth switch are turned on.

7. The device of claim 6, wherein
when the up signal received from the phase detector is at a higher level than the certain level, the third switch, the fourth switch, the fifth switch, the sixth switch, and the ninth switch, the tenth switch, the eleventh switch, and the twelfth switch are turned on.

8. The device of claim 7, wherein
when the up signal received from the phase detector is at the higher level, compared to a case where both the up signal and the down signal are at the certain level, the current flowing in the voltage-controlled oscillator buffer increases and the slew rate of the clock output by the voltage-controlled oscillator increases, so that the data output by the equalizer and the clock output by the voltage-controlled oscillator are synchronized.

9. The device of claim 6, wherein
when the down signal received from the phase detector is at a higher level than the certain level, the third switch, the fourth switch, the fifth switch, the sixth switch, the ninth switch, the tenth switch, the eleventh switch, the twelfth switch are turned off.

10. The device of claim 9, wherein
when the down signal received from the phase detector is at the higher level, compared to a case where both the up signal and the down signal are at the certain level, the current flowing in the voltage-controlled oscillator buffer decreases and the slew rate of the clock output by the voltage-controlled oscillator decreases, so that the data output by the equalizer and the clock output by the voltage-controlled oscillator are synchronized.

* * * * *